United States Patent [19]

Griffiths et al.

[11] Patent Number: 4,752,881
[45] Date of Patent: Jun. 21, 1988

[54] ELECTRICAL RESISTIVITY GEOLOGICAL SURVEYING APPARATUS AND METHOD UTILIZING PLURAL CABLE SECTIONS WITH CONTROLLED DISTRIBUTED ELECTRODE/CABLE CONDUCTOR SWITCHING

[75] Inventors: Donald H. Griffiths; John Turnbull, both of Birmingham, United Kingdom

[73] Assignee: The University of Birmingham of Chancellor's Court, Great Britain

[21] Appl. No.: 816,611

[22] Filed: Jan. 6, 1986

[30] Foreign Application Priority Data

Jan. 8, 1985 [GB] United Kingdom ............. 8500390

[51] Int. Cl.$^4$ .................... G06F 15/20; G01V 3/00
[52] U.S. Cl. .................... 364/420; 324/347; 324/354
[58] Field of Search ............. 364/420, 421, 481–482; 324/62, 323, 347, 354; 367/14, 20–21, 36–37, 117

[56] References Cited

U.S. PATENT DOCUMENTS

| | | | |
|---|---|---|---|
| 1,744,566 | 1/1930 | Mott | 324/62 |
| 2,172,778 | 9/1939 | Taylor, Jr. | 324/354 X |
| 3,887,897 | 6/1975 | Neitzel et al. | 367/20 X |
| 3,975,674 | 8/1976 | McEven | 324/323 X |
| 4,041,372 | 8/1977 | Miller et al. | 324/9 |
| 4,246,538 | 1/1981 | Barker | 324/347 |
| 4,322,805 | 3/1982 | Rog et al. | 364/481 |
| 4,356,444 | 10/1982 | Saenz, Jr. | 324/54 |
| 4,497,045 | 1/1985 | Miller | 367/20 X |
| 4,583,170 | 4/1986 | Carlin et al. | 364/420 |

FOREIGN PATENT DOCUMENTS 2006969A  5/1979  United Kingdom .

Primary Examiner—Gary V. Harkcom
Attorney, Agent, or Firm—Nixon & Vanderhye

[57] ABSTRACT

A resistivity surveying apparatus comprises a base station (9) and 30 reels (RL1 to RL30). The base station (9) comprises a computer (10) and a resistivity meter (11) having four output terminals. Each reel has a multi-line cable (CB1 to CB30) which includes four resistivity measuring lines for connection to the output terminals of meter (11) and further lines for connection to the output terminals of computer (10). An electrode (EL1 to EL30) which may be driven into the ground is mounted on each reel. In the hub of each reel (RL1 to RL30), there is provided a circuit (CKT1 to CKT30) for connecting the electrode (EL1 to EL30) to one of the resistivity measuring lines under the control of the computer (10). In operation, the electrodes are driven into the ground at spaced intervals. The free end of one (CB1) of the cables is connected to the base station (9) and the remaining cables are connected in series. The computer (10) then drives the apparatus through a measurement sequence. For each measurement, four electrodes are slected and connected to respective ones of the resistivity measuring lines.

12 Claims, 4 Drawing Sheets

ELECTRICAL RESISTIVITY GEOLOGICAL SURVEYING APPARATUS AND METHOD UTILIZING PLURAL CABLE SECTIONS WITH CONTROLLED DISTRIBUTED ELECTRODE/CABLE CONDUCTOR SWITCHING

BACKGROUND OF THE INVENTION

This invention relates to apparatus for performing electrical resistivity surveying.

In some circumstances variations in the electrical conductivity of the subsurface can be mapped by making measurements of ground resistivity on the surface. Since rock types differ considerably in their conductivity, provided the structure is relatively simple, a picture of the subsurface geology can be built up from such measurements.

In a simple technique of resistivity surveying, four electrodes are driven into the ground to form an equi-spaced collinear array. Very low frequency alternating current is supplied to two of the electrodes and the potential difference is measured across the other two electrodes. Where the ground is horizontally layered a single set of measurements with increasing electrode separation is all that is necessary to carry out a quantitative interpretation. Where the boundary between different layers varies in one lateral direction, the data required for performing a quantitative interpretation of the subsurface conductivity can be obtained by traversing the four electrode array repeatedly over the same profile with progressively increased electrode separation. The maximum separation depends upon the maximum depth to which information is required. So far this has been done by using four separate cables and by moving the electrodes between readings. Where depths of 200–300 meters are being investigated over a profile of many miles, the labour required to perform the readings makes this method impracticable.

SUMMARY OF THE INVENTION

It is an object of this invention to provide a new and improved resistivity apparatus in which the above mentioned problem is overcome or reduced.

According to one aspect of this invention there is provided resistivity surveying apparatus comprising a base station which includes a computer for controlling the apparatus and a resistivity meter having four terminals for measuring resistivity, a multi-line cable which includes four resistivity measuring lines for connection to respective ones of the resistivity measuring terminals, and a set of substations located at spaced intervals along the cable, each substation comprising an electrode which may be driven into the ground, switching means for connecting the electrode to a selected one of the measuring lines, and a circuit for operating the switching means, the computer being arranged to drive the apparatus through a measurement sequence in which in each individual resistivity measurement four electrodes are selected and connected to respective ones of the resistivity measuring lines.

With the apparatus of the present invention, the electrodes are initially driven into the ground at spaced intervals along the profile which is to be investigated. All the desired measurement can then be made without moving the electrodes.

Conveniently, the cable is divided into sections, each section being mounted on a reel.

In each substation, the electrode may be mounted on its associated reel and the switching means and operating circuit may be mounted in the hub of the associated reel.

The computer may be arranged to record the individual resistivity measurements.

It is another object of this invention to provide a reel assembly for resistivity surveying apparatus.

According to another aspect of this invention there is provided a reel assembly for resistivity surveying apparatus comprising a reel, a cable section mounted on the reel and including four lines for measuring resistivity, an electrode which may be driven into the ground mounted on the reel, switching means for connecting the electrode to a selected one of the resistivity measuring lines, and a circuit for operating the switching means.

BRIEF DESCRIPTION OF THE DRAWINGS

This invention will now be described in more detail with reference to the drawings.

DETAILED DESCRIPTION OF EXEMPLARY PREFERRED EMBODIMENT(S)

Figure 1:
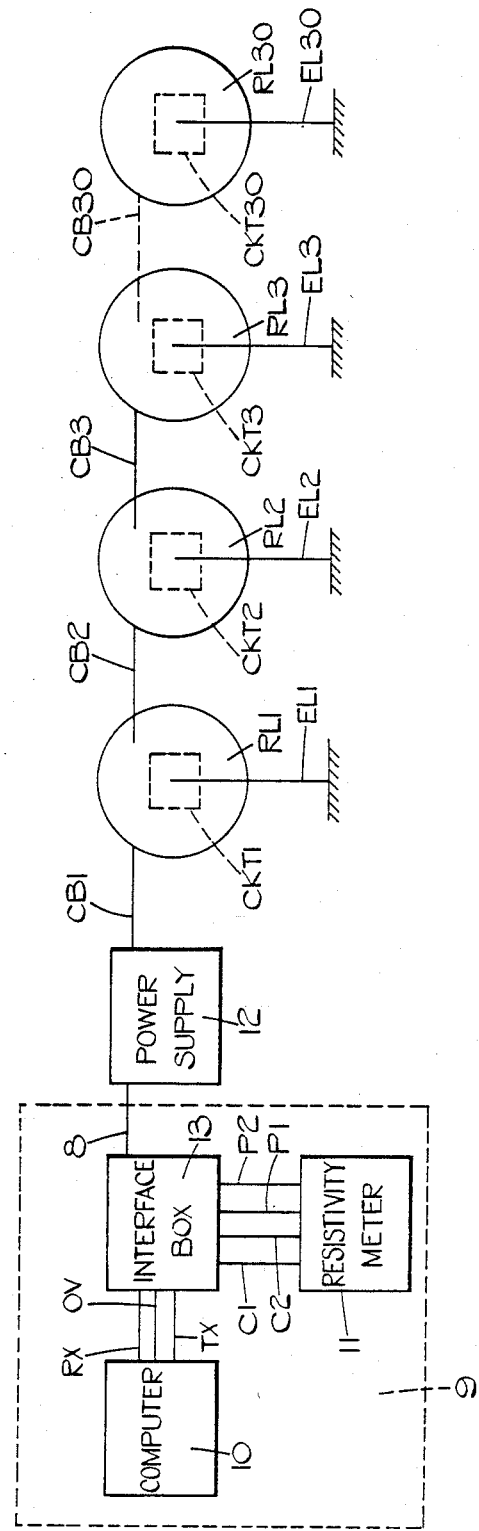
FIG. 1 is a block diagram of resistivity surveying apparatus embodying this invention.

The apparatus which is shown in use in FIG. 1 comprises a base station 9, five identical power supply circuits and thirty reels RL1 to RL30. Only one of the power supply circuits is shown, this circuit being indicated by reference numeral 12, and only reels RL1, RL2, RL3 and RL30 are shown in FIG. 1.

The base station 9 comprises a computer 10 which in the present example is an Epson HX-20 portable computer, a resistivity meter 11 which in the present example is a type SAS 300 terrameter made by Atlas Copco ABEM AB, and an interface box 13. The computer 10 has an 0 V terminal, a transmitting terminal and a receiving terminal which are connected respectively to lines 0 V, TX and RX. The resistivity meter 11 has a pair of terminals for supplying low frequency alternating current and these are connected to lines $C_1$ and $C_2$ and a pair of terminals for measuring potential which are connected to lines $P_1$ and $P_2$. In the interface box 13 the lines from the computer 10 and resistivity meter 11 are connected by a plug and socket to one end of a screened multi-line cable 8.

The other end of cable 8 is connected through a plug and socket on the input side of power supply circuit 12, a set of direct connections inside the circuit 12, and a plug and socket on the output side of circuit 12 to one end of a 50 m screened multi-line cable CB1 mounted on reel RL1. The power supply circuit 12 provides power at nominal $+12$ V and $-12$ V and the $+12$ V and $-12$ V supplies are connected by the plug and socket on its output side to a mominal $+12$ V line and a nominal $-12$ V line of cable CB1. It is to be noted that the $+12$ V and $-12$ V supplies are not connected to cable 8. 50 m screened multi-line cables CB2 and CB30 are mounted on the remaining reels RL2 to RL30. The free end of each of cables CB7, CB13, CB19 and CB25 is connected by a respective power supply circuit to the cable of the preceding cable and thus each power supply circuit drives six reels. The free end of each of the remaining cables is connected directly to the cable of the preceding reel by a plug and socket.

The reels RL1 to RL30 are provided with electronic circuits CKT1 to CKT30 and electrodes EL1 to EL30. The electronic circuits CKT1 to CKT30 are mounted in watertight boxes in the hubs of their respective reels. The electrodes EL1 to EL30 are metal stakes which are driven into the ground at equal intervals up to a maximum of 50 m intervals along the profile to be investigated so as to form a linear array. Each electronic circuit and associated electrode forms a substation.

Figure 2:
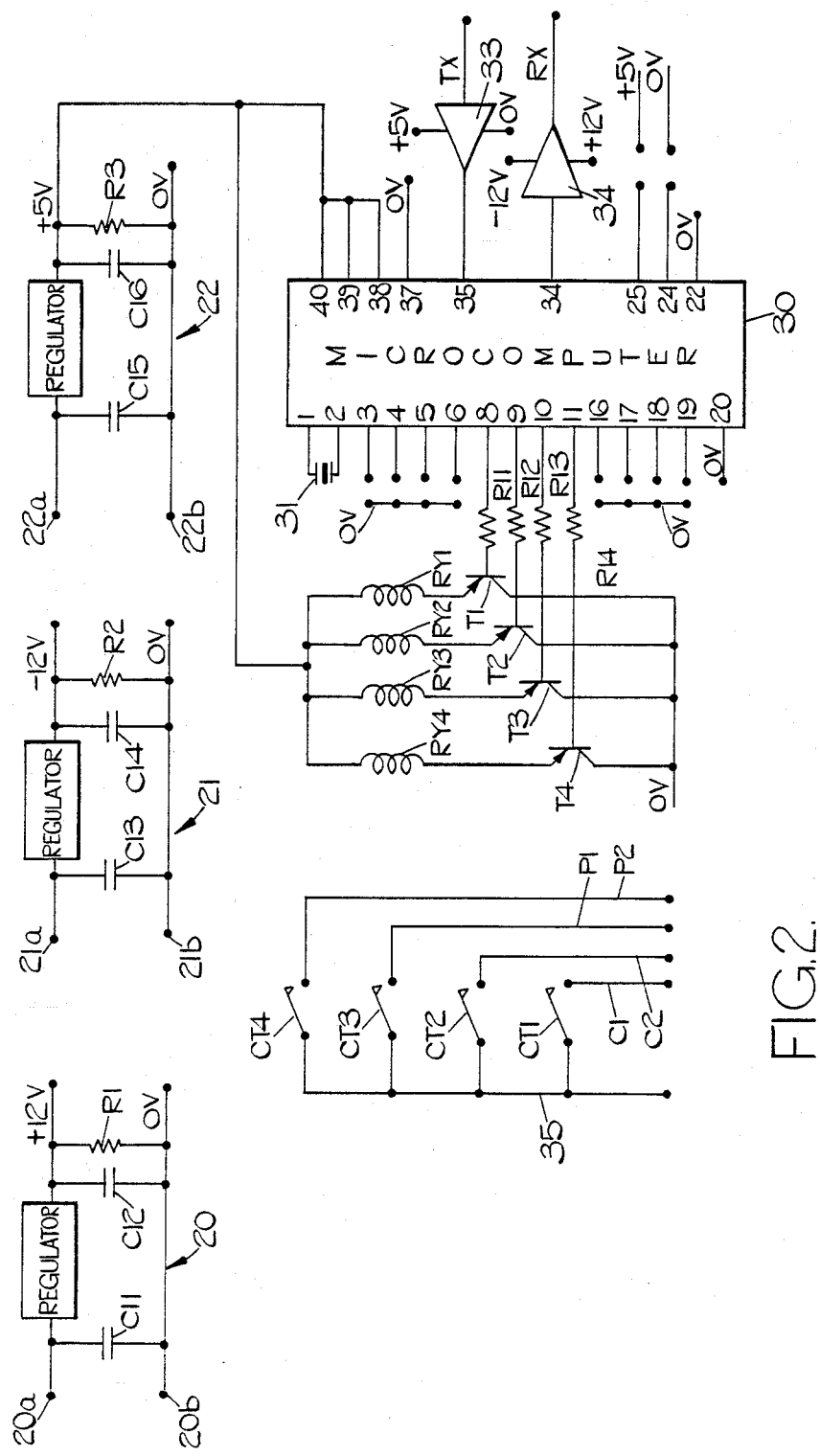
FIG. 2 is a circuit diagram of a substation forming part of the apparatus of FIG. 1.

The hardware of electronic circuits CKT1 to CKT30 are identical and the circuit diagram for circuit CKT1 is shown in FIG. 2. Circuit CKT1 includes three power regulator circuits 20, 21 and 22. The circuit 20 includes a type 78L12+12 V power regulator, the input of which is connected by a pair of terminals 20a and 20b to the nominal +12 V line and the 0 V line and the output of which is connected to a regulated +12 V line. Circuit 20 also includes a smoothing capacitor C11 on its input side and a smoothing capacitor C12 and a resistor R1 on its output side. Circuit 21 includes a −12 V type 79L12 power regulator, the input of which is connected by a pair of terminals 21a and 21b to the nominal −12 V line and the 0 V line and the output of which is connected to a regulated −12 V line. Circuit 21 includes a smoothing capacitor C13 on its input side and a smoothing capacitor C14 and a resistor R2 on its output side. Circuit 22 includes a +5 V type 7805 power regulator, the input of which is connected by a pair of terminals 22a and 22b to the nominal +12 V line and the 0 V line and the output of which is connected to a +5 V line. Circuit 22 includes a smoothing capacitor C15 on its input side and a smoothing capacitor C16 and a resistor R3 on its output side.

The circuit CKT1 further includes a Mostek type SCU 20 microcomputer indicated at reference numberal 30. In microcomputer 30, pins 1 and 2 are connected to a quartz crystal 31 turned to a frequency of 3.6865 MHz. Pins 20, 22 and 37 are connected to the 0 V line and pins 38, 39 and 40 are connected to the +5 V line. Pins 24 and 25 are baud rate select pins which can be independently connected to the +5 V line or the 0 V line to select one of four baud rates. The line TX is connected to pin 35 via a type 1489 line receiver 33 and pin 34 is connected to the line RX by a type 1488 line driver 34. The −12 V and +12 V power supply terminals of the line driver 34 are connected to the regulated +12 V and −12 V lines of circuits 20 and 21 and the +5 V and 0 V terminals of line receiver 33 are connected to the regulated +5 V line and to the OV line.

Pins 3 to 6 and 16 to 19 of microcomputer 30 are address pins and these may be selectively connected to the OV Line so as to provide the microcomputer 30 with a hard-wired address for control by computer 10.

Pins 8, 9, 10 and 11 of microcomputer 30 are connected by resistors R11 to R14 to the bases of four PNP transistors T1 to T4. The collectors of these transistors are connected to the 0 V line and the emitters are connected by relay coils RY1 to RY4 to the +5 V line. The relay coils RY1 to RY4 operate four reed relay switches CT1 to CT4. One end of each of the switches CT1 to CT4 is connected to a line 35 which is connected to electrode EL1. The other ends of switches CT1 to CT4 are connected to lines $C_1$, $C_2$, $P_1$ and $P_2$. Thus, the switches CT1 to CT4 may be operated to connect the electrode EL1 to one of lines $C_1$, $C_2$, $P_1$, and $P_2$.

Figure 3:
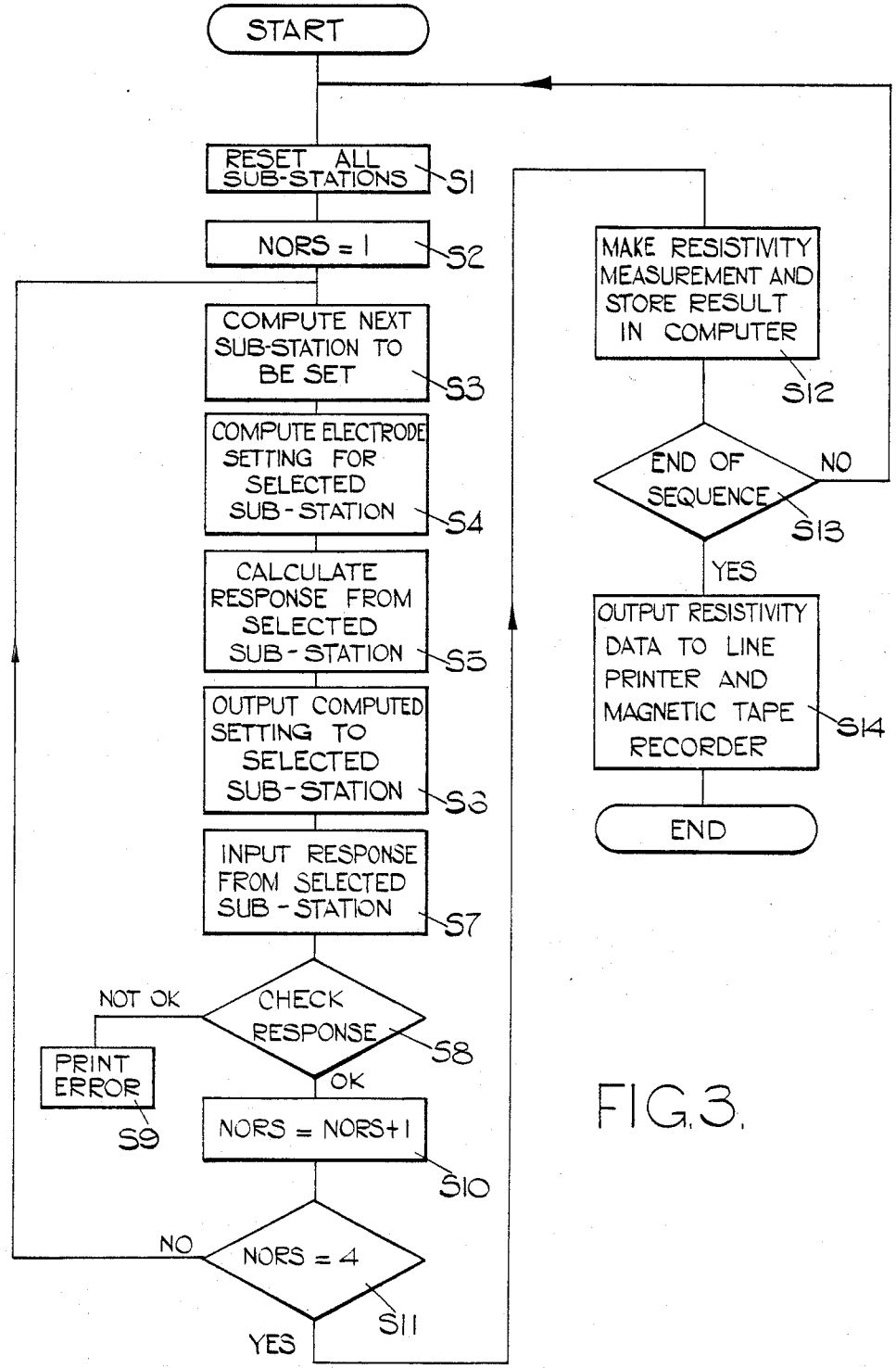
FIG. 3 is a flow chart illustrating the operation of the apparatus of FIG. 1.

The computer 10 is provided with a program for performing a measurement sequence and this program will now be described with reference to FIG. 3.

After entering the program, in a step S1 all substations are reset as a result of which none of the electrodes EL1 to EL30 is connected to any of lines $C_1$, $C_2$, $P_1$ and $P_2$. Next, in a step S2, a variable NORS is set to 1.

In the next part of the program, four of the substations are selected to make a measurement and their electrodes are connected to appropriate one of lines $C_1$, $C_2$, $P_1$ and $P_2$.

Thus, in the step S3, the next substation to be set is selected. The selected substation will be one of the four substations used to make the measurement and so its electrode will be connected to one of lines $C_1$, $C_2$, $P_1$ and $P_2$. This electrode setting is calculated in a step S4. Each microcomputer is arranged to provide a response to the computer after receiving instructions and the response which should be received from the selected substation is calculated in a step S5.

In a step S6, the computed setting is transmitted to the selected substation and in a step S7 the selected substation transmits its response to computer 10. In a step S8 the response is checked. If the response is not in accordance with that calculated in step S5, an error signal is provided in a step S9 and the program terminates. If the response is correct, in a step S10, the variable NORS is incremented. In a step S11, variable NORS is examined. If it is less than 4, the program returns to S3 to set the next substation. If NORS equals 4, all substations are set and, in a step S12, a resistivity measurement is made.

In the present example, the measurement is made by manual operation of meter 11 and manually entering the result into computer 10. However, the apparatus may be easily modified so that the measurement is performed automatically.

After making the measurement, in a step S13, a check is made to determine if the sequence of measurements is complete. If the sequence is not complete, the program returns to step S1 in order to make the next measurement. If the result is complete, the measurements are entered on the line printer which forms parts of computer 10 and the results are also stored on magnetic tape.

Figure 4:
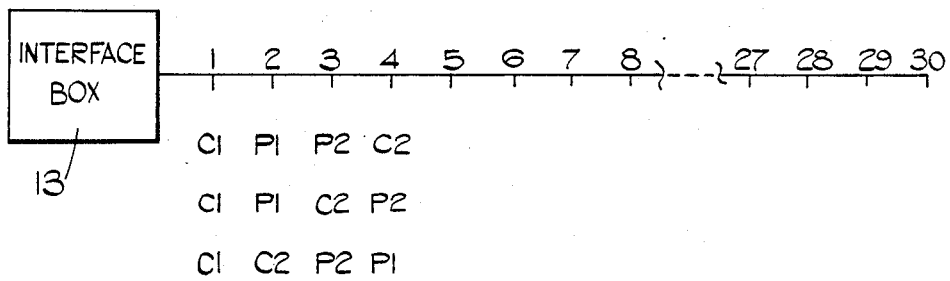
FIG. 4 is a chart showing the initial starting positions of three measurement sequences which may be performed by the apparatus of FIG. 1.
Figure 5:
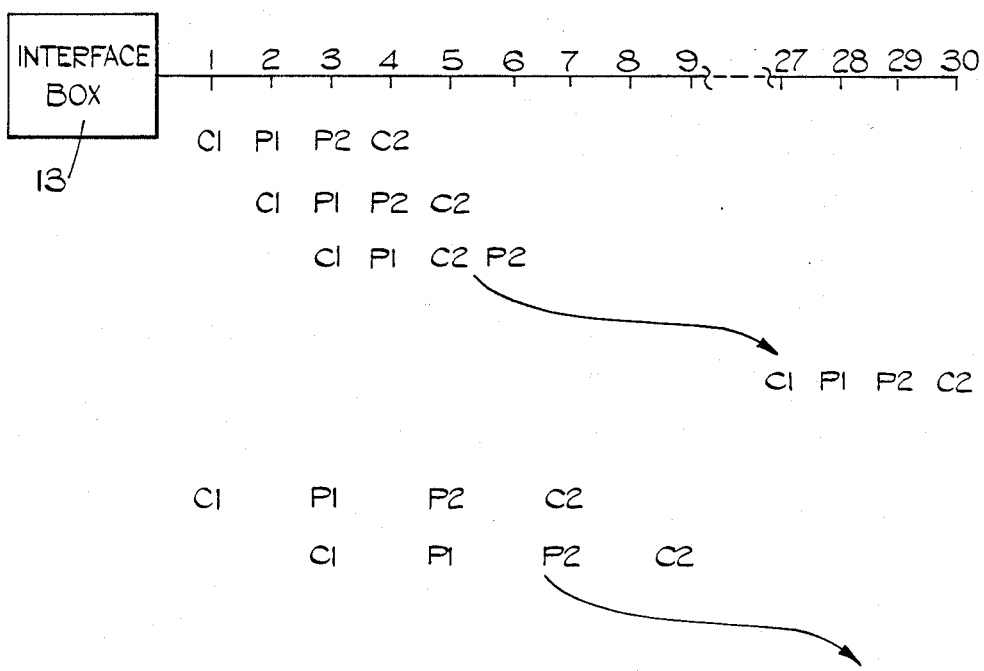
FIG. 5 is a chart illustrating a measurement sequence.

FIGS. 4 and 5 show some possible electrode settings. In both of these figures, the electrodes EL1 to EL30 are indicated by reference numerals 1 to 30 and their positions are shown in relation to the interface box 13. Also, in these figures, the connection of an electrode to one of lines $C_1$, $C_2$, $P_1$ and $P_2$ is designated by like references.

FIG. 4 shows three possible settings for the initial measurement of a sequence. The three settings shown correspond respectively to the Wenner alpha, gamma and beta electrode configurations. In FIG. 5, a complete measurement sequence using the Wenner alpha electrode configuration is shown.

As may be appreciated, when the electrodes EL1 to EL30 have been driven into the ground, one or more sequences of measurements may be made without repositioning the electrodes. Thus, with a minimum amount of labour, data may be obtained to investigate a complex geological structure up to depths of around 150 m or more. Greater depths may be investigated by adding more substations. By moving the cables forward in sections along the line of the cables, many miles of profile may be measured.

Although in the example described above, the computer 10 and resistivity meter 11 are formed separately, they may alternatively be formed as a single electronic instrument.

Although in the present example the base station 9 is situated at one end of reels RL1 to RL30, it may alternatively be situated on an intermediate position. Also, an additional substation together with an additional ground electrode may be incorporated into the base station.

What is claimed is:

1. A resistivity surveying apparatus including a plurality of ground electrodes and resistance meter, terminals, said apparatus comprising:
    a base station which includes (a) a computer for controlling the apparatus through a measurement sequence in which a predetermined sequence of electrical connections is successively effected between different subsets of ground electrodes and resistance meter terminals and (b) a resistivity meter having four terminals for measuring resistivity,
    a multi-line cable which includes four resistivity measuring lines for connection to respective ones of the resistivity measuring terminals, and
    a set of substations located at spaced intervals along the cable, each substation comprising an electrode which may be driven into the ground, switching means for connecting the electrode to a selected one of the measuring lines, and a circuit for operating the switching means,
    the computer being arranged to drive the apparatus through a measurement sequence in which, in each individual resistivity measurement, four electrodes are selected and connected to respective ones of the resistivity measuring lines.

2. An apparatus as claimed in claim 1 in which the the cable is divided into sections, each section being mounted on a reel.

3. An apparatus as claimed in claim 2 in which, in each substation, the electrode is mounted on its associated reel and the switching means and operating circuit are mounted in the hub of the associated reel.

4. An apparatus as claimed in claim 1 in which the computer is arranged to record the individual resistivity measurements.

5. A reel assembly for use with resistivity surveying apparatus, said reel assembly comprising:
    a reel,
    a cable section mounted on the reel and including four lines for measuring resistivity,
    an electrode, which may be driven into the ground, mounted on the reel,
    switching means for connecting the electrode to a selected one of the resistivity measuring lines, and
    a circuit for operating the switching means in response to control signals received over said cable section.

6. A resistivity surveying apparatus comprising:
    a base station which includes
        a computer having a transmitting terminal and a resistivity meter having four terminals for measuring resistivity,
    a multi-line cable which includes four resistivity measuring lines for connection to respective ones of the resistivity measuring terminals, and
    a control data line for connection to the transmitting terminal of the computer; and
    a set of sub-stations located at spaced intervals along the cable, each substation comprising
        an electrode which may be driven into the ground,
        switching means for connecting the electrode to a selected one of the measuring lines, and
        a circuit connected to the control data line for operating the switching means;
    the computer being arranged to drive the apparatus through a sequence of resistivity measurements, in each individual resistivity measurement the computer selecting four of the substations to make the measurement, computing the electrode setting for each of the four selected substations, and transmitting the four computed settings along the control data line so that the electrodes in the four selected substations are connected to appropriate ones of the resistivity measuring lines.

7. An apparatus as claimed in claim 6, in which in each substation the circuit for operating the switching means comprises a microcomputer.

8. An apparatus as claimed in claim 6 in which the cable is divided into sections, each section being mounted on a reel, and in each substation the electrode being mounted on an associated reel and the switching means and operating circuit being mounted in the hub of the associated reel.

9. An apparatus as claimed in claim 6 in which the computer is arranged to record the individual resistivity measurements.

10. A reel assembly for use with resistivity surveying apparatus comprising:
    a reel,
    a cable section mounted on the reel and including four lines for measuring resistivity and a control data line,
    an electrode which may be driven into the ground mounted on the reel,
    switching means for connecting the electrode to a selected one of the resistivity measuring lines, and
    a circuit connected to the control data line for operating the switching means.

11. Resistivity geological surveying apparatus comprising:
    a base station having a resistivity meter with plural resistivity measuring terminals;
    a plurality of sub-stations displaced from one another over a portion of the earth's surface in a predetermined spatial array, each sub-station including a ground-contacting electrode;
    said base station and each of said sub-stations being connected by a multi-conductor cable having a respective conductor thereof connected with each of said resistivity measuring terminals and also having at least one control communication signalling conductor;
    each of said sub-stations including a controllable switch means for locally connecting its ground-contacting electrode to a selected cable conductor in response to control signals received via said control communication signalling conductor; and
    control means located at said base station and connected to said control communication signalling conductor for generating said control signals thereonto and causing a predetermined sequence of subsets of said electrodes to be individually connected with respective ones of said resistivity measuring terminals so as to effect a predetermined sequence of resistivity geological survey measurements.

12. A method for effecting a predetermined sequence of resistivity geological survey measurements using a resistivity meter having N terminals, said method comprising the steps of:

arranging a plurality of ground-contacting electrodes in a predetermined spatial array of electrode sites over a portion of the earth's surface;

arranging N conductors between a base station site and each of said electrode sites;

arranging at least one further control conductor between said base station site and each of said electrode sites;

generating control signals at said base station site onto said control conductor and, in response thereto, effecting locally switched contact, at each of a selected subset of electrode sites, between the ground-contacting electrode thereat and one of said N conductors.

* * * * *